(12) United States Patent
Bu

(10) Patent No.: US 7,773,423 B1
(45) Date of Patent: Aug. 10, 2010

(54) LOW POWER, CMOS COMPATIBLE NON-VOLATILE MEMORY CELL AND RELATED METHOD AND MEMORY ARRAY

(75) Inventor: Jiankang Bu, Windham, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 298 days.

(21) Appl. No.: 11/904,515

(22) Filed: Sep. 27, 2007

(51) Int. Cl.
*G11C 16/04* (2006.01)

(52) U.S. Cl. .............. 365/185.18; 365/185.24; 365/185.28

(58) Field of Classification Search ........ 365/185.18 O, 365/185.23, 185.24 X, 185.28 X, 185.29, 365/185.18, 185.24, 185.28
See application file for complete search history.

(56) References Cited

U.S. PATENT DOCUMENTS

| | | | |
|---|---|---|---|
| 6,853,583 B2 * | 2/2005 | Diorio et al. | 365/185.21 |
| 6,888,192 B2 * | 5/2005 | Lojek | 257/315 |
| 7,391,647 B2 * | 6/2008 | Fang et al. | 365/185.18 |
| 7,411,829 B2 * | 8/2008 | Diorio et al. | 365/185.18 |

OTHER PUBLICATIONS

F. Matsuoka et al., "Drain Avalanche Hot Hole Injection Mode on PMOSFETs," 1988 IEEE, 4 pages.

Yanjun Ma et al., "Reliability of pFET EEPROM With 70-Å Tunnel Oxide Manufactured in Generic Logic CMOS Processes," IEEE Transactions on Device and Materials Reliability, vol. 4, No. 3, Sep. 2004.

L. Chang et al., "Non-Volatile memory device with true CMOS compatibility," Electronics Letters, Aug. 19, 1999, vol. 35, No. 17, pp. 1443-1445.

Nelson S. Saks et al., "Observation of Hot-Hole Injection in NMOS Transistors Using a Modified Floating-Gate Technique," IEEE Transactions on Electron Devices, vol. ED-33, No. 10, Oct. 1986, pp. 1529-1534.

* cited by examiner

*Primary Examiner*—VanThu Nguyen

(57) ABSTRACT

A memory cell includes a first transistor and a second transistor. Gates of the transistors are coupled together to form a floating gate. During programming, a first voltage is applied to a source and a drain of the first transistor, such as a negative voltage (like −5V). This causes electrons from the source and the drain of the first transistor to be injected onto the floating gate. During erasure, a second voltage could be applied to a source and a drain of the second transistor, such as a positive voltage (like +5V). This causes hot holes from the source and the drain of the second transistor to be injected onto the floating gate. The memory cell could also be erased by generating an electric field across a gate oxide of the second transistor, which allows electrons on the floating gate to tunnel through the gate oxide.

20 Claims, 4 Drawing Sheets

LOW POWER, CMOS COMPATIBLE NON-VOLATILE MEMORY CELL AND RELATED METHOD AND MEMORY ARRAY

TECHNICAL FIELD

This disclosure is generally directed to memory cells and more specifically to a low power, complimentary metal oxide semiconductor (CMOS) compatible non-volatile memory cell and related method and memory array.

BACKGROUND

Conventional non-volatile memory (NVM) cells are routinely used in electronic circuitry, such as electronic consumer devices. A typical non-volatile memory cell often includes multiple transistors with a floating gate. A charge stored on the floating gate typically represents the logical value stored in the non-volatile memory cell.

Drain avalanche hot carrier (DAHC) injection and Fowler-Nordheim (FN) tunneling are two common techniques for programming and erasing conventional non-volatile memory cells. For example, drain avalanche hot carrier injection can be used by applying a high voltage at the drain of a program transistor in a non-volatile memory cell. This generates a large electric field at the drain of the program transistor, which accelerates electrons onto the floating gate and programs the non-volatile memory cell. As another example, Fowler-Nordheim tunneling can be used by applying a high voltage at a control gate of the program transistor in the non-volatile memory cell. This generates an electric field through a gate oxide separating the program transistor from the floating gate, allowing electrons to reach the floating gate.

Drain avalanche hot carrier injection and Fowler-Nordheim tunneling have various drawbacks. For example, these techniques may require a large electrical current in order to program a conventional non-volatile memory cell, such as several hundred microamps. As a result, power consumption in the conventional non-volatile memory cells is high. Moreover, this high programming current often limits the number of non-volatile memory cells that can be programmed simultaneously. As a particular example, if the programming current is 200 µA for a single non-volatile memory cell, it may only be possible to program eight bits (eight memory cells requiring 1.6 mA total current) or sixteen bits (sixteen memory cells requiring 3.2 mA total current) simultaneously. Because of this, it may take a relatively long time to initialize or program a large memory array. In addition, Fowler-Nordheim tunneling often has reliability issues related to the use of high voltages.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

FIGS. 1A through 4, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

Figure 1A:
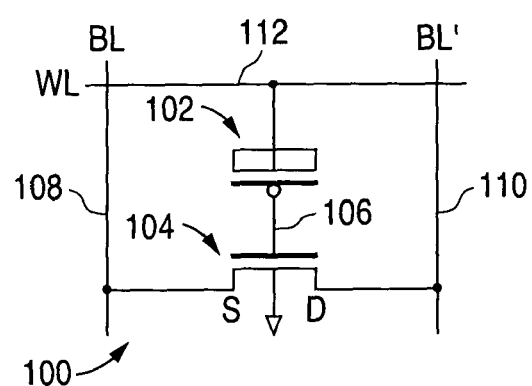
FIGS. 1A and 1B illustrate example non-volatile memory cells according to this disclosure.
Figure 1B:
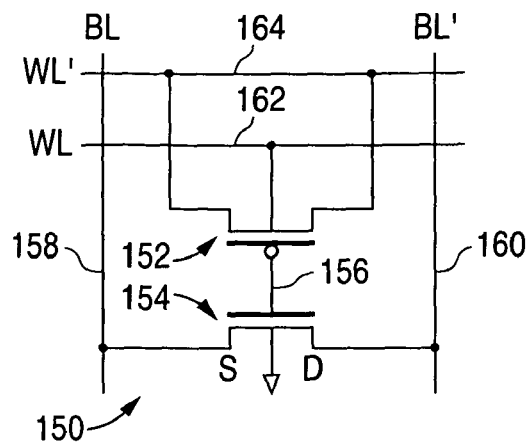

FIGS. 1A and 1B illustrate example non-volatile memory cells according to this disclosure. The embodiments of the memory cells shown in FIGS. 1A and 1B are for illustration only. Other embodiments of the memory cells could be used without departing from the scope of this disclosure.

As shown in FIG. 1A, a memory cell 100 includes two transistors 102 and 104 having a floating gate 106, a first bit line (BL) 108, a second bit line (BL') 110, and a write line (WL) 112. In this example, the transistor 102 has a source, body, and drain coupled to the write line 112. The transistor 104 has a source coupled to the bit line 108, a drain coupled to the bit line 110, and a body coupled to ground. Gates of the transistors 102 and 104 are coupled together to form the floating gate 106. The floating gate 106 is "floating" since it is not coupled to any known potential.

In this example embodiment, the transistor 102 represents a p-channel metal oxide semiconductor (PMOS) transistor, and the transistor 104 represents an n-channel metal oxide semiconductor (NMOS) transistor. When coupled as shown in FIG. 1A, the transistor 102 acts as a program transistor, and the transistor 104 acts as an erase capacitor. The program transistor is used to program a value into the memory cell 100, and the erase capacitor is used to erase a value from the memory cell 100.

The bit line 108 represents a wire, trace, or other electrically conductive line that is coupled to the source of the transistor 104 and is capable of conducting a voltage or current signal. Similarly, the bit line 110 represents a wire, trace, or other electrically conductive line that is coupled to the drain of the transistor 104 and is capable of conducting a voltage or current signal. In addition, the write line 112 represents a wire, trace, or other electrically conductive line that is coupled to the source, body, and drain of the transistor 102 and is capable of conducting a voltage or current signal.

As shown in FIG. 1B, a memory cell 150 similarly includes two transistors 152 and 154 having a floating gate 156, a first bit line (BL) 158, a second bit line (BL') 160, a first write line (WL) 162, and a second write line (WL') 164. In this example, the transistor 152 has a body coupled to the write line 162 and a source and drain coupled to the write line 164. The transistor 154 has a source coupled to the bit line 158, a drain coupled to the bit line 160, and a body coupled to ground. Gates of the transistors 152 and 154 are coupled together to form the floating gate 156.

In this example embodiment, the transistor 152 represents a PMOS transistor, and the transistor 154 represents an NMOS transistor. When coupled as shown in FIG. 1B, the transistor 152 acts as a program transistor, and the transistor 154 acts as an erase capacitor. The program transistor is used to program a value into the memory cell 150, and the erase capacitor is used to erase a value from the memory cell 150. Also, each of the bit lines 158-160 and write lines 162-164 represents a wire, trace, or other electrically conductive line that is capable of conducting a voltage or current signal.

In a conventional non-volatile memory cell, the programming current is typically higher because the conventional memory cell needs to create a channel current in its program transistor. The channel current represents a current flowing from the source to the drain of the program transistor. The channel current initiates an impact ionization process at the drain of the program transistor, which leads to the creation of free electrons and injection of some of the free electrons onto the floating gate (drain avalanche hot carrier injection). Also, in conventional non-volatile memory cells, hot electron injection efficiency is lower, which increases the required programming current. As a particular example, to generate a hot carrier current of 50 pA/$\mu m^2$, conventional non-volatile memory cells often require 100 $\mu A/\mu m^2$-1000 $\mu A/\mu m^2$ of channel current. For a single 0.44/0.4 $\mu m$ memory cell, this could require at least 20 $\mu A$ of channel current for a 10 pA gate injection current.

In accordance with this disclosure, high channel current or other disadvantages associated with conventional non-volatile memory cells can be reduced or eliminated by generating hot carriers in the memory cells 100 and 150. A "hot carrier" generally refers to a "hot electron" or a "hot hole" that has gained high kinetic energy by acceleration using an electric field. A "hot hole" generally refers to a vacant position remaining after an electron is freed, and holes can move within a semiconductor material in a non-volatile memory cell.

In the embodiments shown in FIGS. 1A and 1B, the memory cells 100 and 150 can be programmed using hot electrons. For example, during a program operation, the source and the drain of the program transistor (transistor 102 or 152) can be biased at the same or approximately the same negative voltage. This causes hot electrons to be generated at both the source junction and the drain junction of the program transistor (unlike conventional drain avalanche hot carrier injection, which generates hot electrons at the drain only). These hot electrons can be injected onto the floating gate of the memory cell, thereby programming the memory cell (changing the memory cell to a programmed state).

In the embodiment shown in FIG. 1A, the memory cell 100 can be erased using Fowler-Nordheim tunneling. During an erase operation using Fowler-Nordheim tunneling, the appropriate voltages can be applied to the source and the drain of the erase capacitor (transistor 104), and electrons from the floating gate 106 can tunnel through a gate oxide to the erase capacitor. This reduces the number of electrons on the floating gate 106, changing the memory cell 100 from a programmed state to an erased state.

In the embodiment shown in FIG. 1B, the memory cell 150 can be erased using hot hole injection. During an erase operation using hot hole injection, the source and the drain of the erase capacitor (transistor 154) can be biased at the same or approximately the same positive voltage. This causes hot holes to be generated at both the source junction and the drain junction of the transistor 154, and the hot holes can be injected onto the floating gate 156. The hot holes recombine with electrons stored on the floating gate 156, changing the memory cell 150 from a programmed state to an erased state.

As described in more detail below, the memory cells 100 and 150 may operate with little or no channel current during programming or erasure of the memory cells 100 and 150. In this way, power consumption in the memory cells 100 and 150 may be extremely low since there is little or no channel current flowing between the sources and drains of the transistors during program and erase operations. Among other things, this may allow more reliable in-field updates of devices already operating in the field (such as devices already sold to consumers). It may also allow simultaneous programming or erasure of a larger number of memory cells (including an entire memory array), which may translate into higher operational speeds. Further, lower voltages may be needed to generate hot carriers compared to Fowler-Nordheim tunneling, which may alleviate high-voltage reliability issues. In addition, because PMOS and NMOS transistors are used in the memory cells 100 and 150, the fabrication process for forming the memory cells 100 and 150 may be the same as or similar to the formation of standard CMOS transistors, providing zero add-on cost for producing the memory cells 100 and 150.

Although FIGS. 1A and 1B illustrate two examples of non-volatile memory cells, various changes may be made to FIGS. 1A and 1B. For example, the layout and arrangement of the transistors, the floating gate, and the bit and write lines in each figure are for illustration only. Also, other or additional components could be used in each of the memory cells 100 and 150. In addition, the memory cell 150 has been described as using hot hole injection to erase the memory cell 150. However, the memory cell 150 could be configured in the same manner as the memory cell 100 (by tying the write lines 162-164 together and/or applying the same or approximately the same voltage to the write lines 162-164). As a result, the memory cell 150 of FIG. 1B could be selectively operated to use either Fowler-Nordheim tunneling or hot hole injection (possibly dynamically during operation) to erase the memory cell 150.

Figure 2:
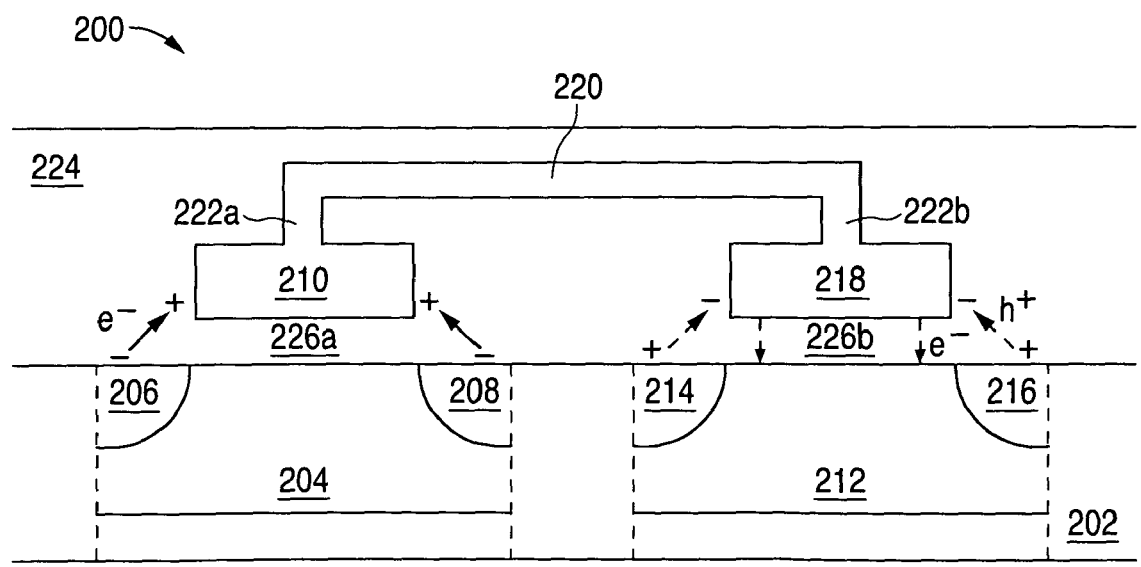
FIG. 2 illustrates an example cross-section of a non-volatile memory cell according to this disclosure.

FIG. 2 illustrates an example cross-section 200 of a non-volatile memory cell according to this disclosure. The cross-section 200 shown in FIG. 2 is described with respect to the non-volatile memory cells 100 and 150 of FIGS. 1A and 1B. The memory cells 100 and 150 could have any other suitable cross-section(s).

As shown here, the memory cell 100 or 150 is formed over a semiconductor substrate 202. The substrate 202 could represent any suitable type of substrate, such as a p-type silicon substrate or other substrate.

The program transistor in the memory cell (PMOS transistor 102 or 152) is formed in an n-well 204. The n-well 204 represents any suitable portion of the substrate 202 that has been doped with an n-type dopant. Within the n-well 204 are doped regions 206-208. The doped region 206 could represent the source of the program transistor, and the doped region 208 could represent the drain of the program transistor. Each of the doped regions 206-208 represents any suitable portion of the substrate 202 that has been doped with a p-type dopant, such as a P+ dopant. A gate contact 210 is formed over the substrate 202 and represents the gate of the program transistor.

The erase capacitor in the memory cell (NMOS transistor 104 or 154) is formed in a p-well 212. The p-well 212 represents any suitable portion of the substrate 202 that has been doped with a p-type dopant. Within the p-well 212 are doped regions 214-216. The doped region 214 could represent the source of the erase capacitor, and the doped region 216 could represent the drain of the erase capacitor. Each of the doped regions 214-216 represents any suitable portion of the substrate 202 that has been doped with an n-type dopant, such as an N+ dopant. A gate contact 218 is formed over the substrate 202 and represents the gate of the erase capacitor.

A conductive layer 220 and two conductive interconnects 222a-222b couple the gate contact 210 of the program transistor and the gate contact 218 of the erase capacitor, thereby forming the floating gate 106 or 156. One or more layers of material 224 are disposed over the substrate 202 and around the conductive layer 220 and conductive interconnects 222a-222b. These layers of material 224 could include any suitable material(s), such as one or more oxide layers, silicon oxynitride layers, titanium nitride layers, or other layer(s). One example technique for forming a gate contact or floating gate is disclosed in U.S. patent application Ser. No. 11/598,560 filed on Nov. 13, 2006, which is hereby incorporated by reference. In this example, the layers of material 224 include a gate oxide 226a in the program transistor (separating the substrate 202 and the gate contact 210) and a gate oxide 226b in the erase capacitor (separating the substrate 202 and the gate contact 218).

As shown in FIG. 2, during a program operation, hot electrons (denoted e⁻) are generated at the source and drain junctions (the doped regions 206 and 208) of the program transistor (PMOS transistor 102 or 152). This places electrons onto the floating gate of the memory cell, causing the memory cell to obtain a first logical state (such as a logical "1") with a high threshold voltage.

As a particular example, during programming, the source and drain of the program transistor can be biased at the same or approximately the same negative voltage. The channel current in this example could be zero or approximately zero. This configuration may cause electric field crowding at the source and drain junction edges, resulting in impact ionization at both the source and drain junctions of the program transistor. The impact ionization could, for example, be initiated by reverse junction current in the program transistor and be partially facilitated by band-to-band tunneling. As a result of the impact ionization, hot electrons are generated at both the source and drain junctions of the program transistor and injected onto the floating gate. This programming technique may consume very little current because little or no channel current is used and low reverse junction current is present.

In particular embodiments of the memory cells 100 and 150, to obtain a 50 pA/$\mu m^2$ gate injection current in the program transistor, only 0.05 $\mu A/um^2$ of reverse junction leakage current at a gate bias of 2.35V and a source/drain junction reverse bias of 5V in the program transistor may be needed. This is approximately 2,000 times smaller than the programming current used in conventional non-volatile memory cells, where a minimum of 100 $\mu A/um^2$ channel current may be needed for a 50 pA/$\mu m^2$ gate injection current. In this example, none or a very small portion of the gate injection current may be due to Fowler-Nordheim tunneling. Under these bias conditions, the Fowler-Nordheim tunneling current density could be less than 0.001 pA/$\mu m^2$ (i.e. 0.1 $\mu A/cm^2$), which is quite negligible. Also, Fowler-Nordheim tunneling might only occur at the source/drain overlap region of the program transistor (not the whole channel), so the majority of the gate injection current may represent hot electrons generated at the source and drain junctions of the program transistor.

During an erase operation via Fowler-Nordheim tunneling, electrons can tunnel through the gate oxide 226b separating the gate contact 218 from the erase capacitor (NMOS transistor 104). The loss of electrons on the floating gate 106 causes the memory cell 100 to obtain a second logical state (such as a logical "0") with a low threshold voltage.

During an erase operation via hot hole injection, hot holes (denoted p⁺) are generated at the source and drain junctions (the doped regions 214 and 216) of the erase capacitor (NMOS transistor 154). These hot holes recombine with electrons on the floating gate 156 of the memory cell 150, causing the memory cell 150 to obtain a second logical state (such as a logical "0") with a low threshold voltage.

As a particular example, during an erase operation using hot holes, the source and the drain of the erase capacitor can be biased at the same or approximately the same positive voltage. Under these conditions, band-to-band tunneling may generate hot holes at the source and drain junctions of the erase capacitor, and the hot holes can be injected onto the floating gate 156 and recombine with electrons on the floating gate 156. In particular embodiments, a gate bias of −2.35V and a 5V source/drain reverse bias in the NMOS transistor 154 can lead to a 1.68 pA/$\mu m^2$ hot hole current with a 0.9 $\mu A/um^2$ junction leakage current. The hot hole current may be noticeably lower than the hot electron current under the same or approximately the same bias, which may be due to the larger effective mass of the holes than the electrons. Compared to Fowler-Nordheim tunneling, the use of hot holes could provide faster erase speeds. In particular embodiments, the junction leakage may be higher using the hot hole erase technique compared to conventional memory cells (but still lower than the drain avalanche hot carrier technique). As a result, the use of hot holes or Fowler-Nordheim tunneling could be a design choice that depends, among other things, on the actual specifications of the design that uses the memory cell 100 or 150.

The various structures shown in FIG. 2 could be formed in any suitable manner using any suitable technique. For example, the various doped regions could be formed by masking the appropriate regions of the substrate 202 and performing the appropriate implantations. Also, the gate oxide regions could be formed by masking the appropriate regions of the substrate 202 and oxidizing the exposed portions of the substrate 202 or by depositing an oxide or other material on the substrate 202. Further, the gate contacts could be formed by depositing a layer of conductive material(s) and etching the layer, and the conductive layer could be formed in the same or similar manner. In addition, the conductive interconnects could be formed by depositing a layer of oxide or other material(s), etching trenches or vias in the oxide or other layer, and depositing polysilicon or other conductive material(s) in the etched trenches or vias. However, the structures shown in FIG. 2 could be formed in any other suitable manner.

Although FIG. 2 illustrates one example of a cross-section 200 of a non-volatile memory cell, various changes may be made to FIG. 2. For example, the non-volatile memory cells 100 and 150 could have any other suitable cross-section.

Figure 3A:
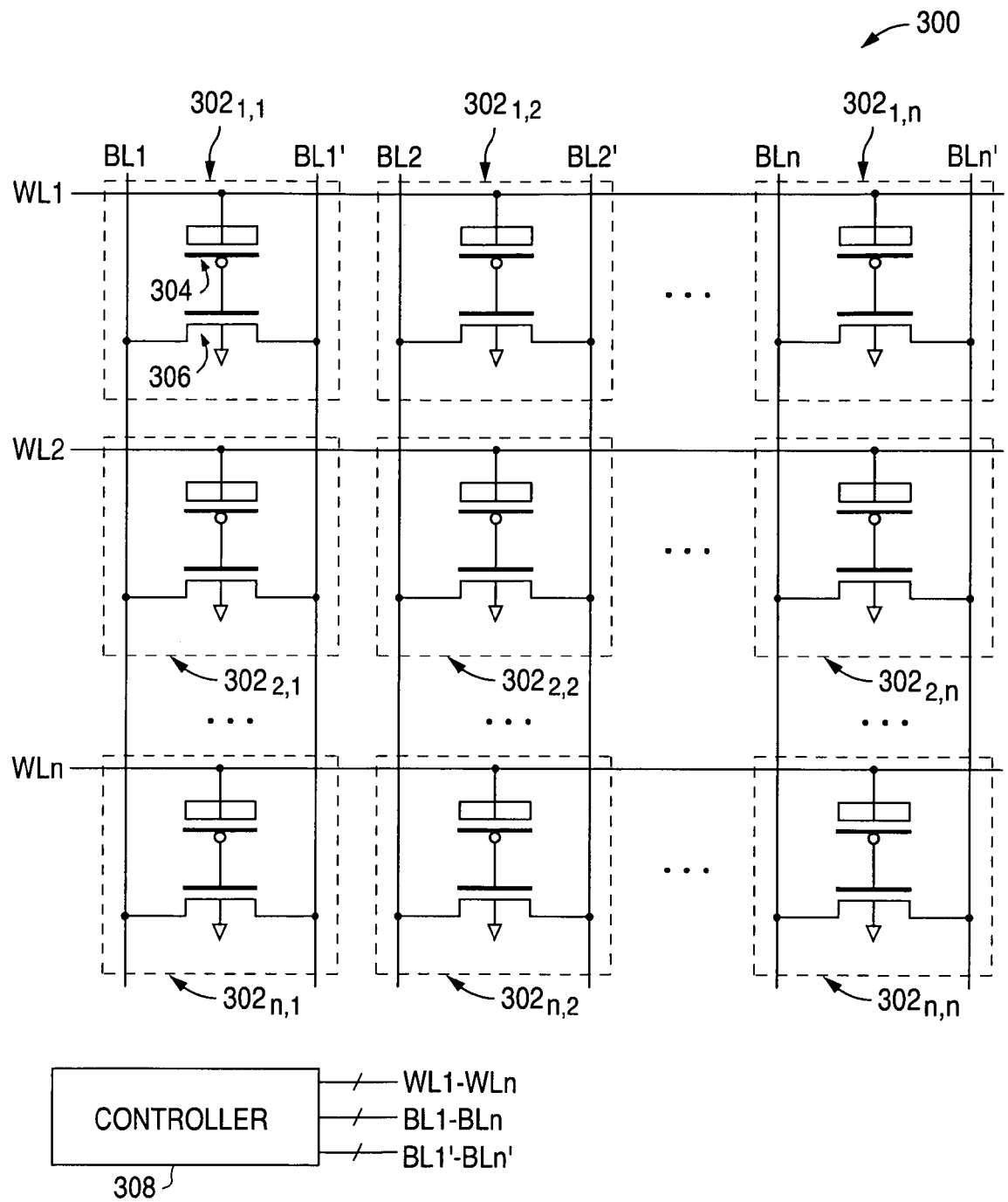
FIGS. 3A and 3B illustrate example non-volatile memory cell arrays according to this disclosure.
Figure 3B:
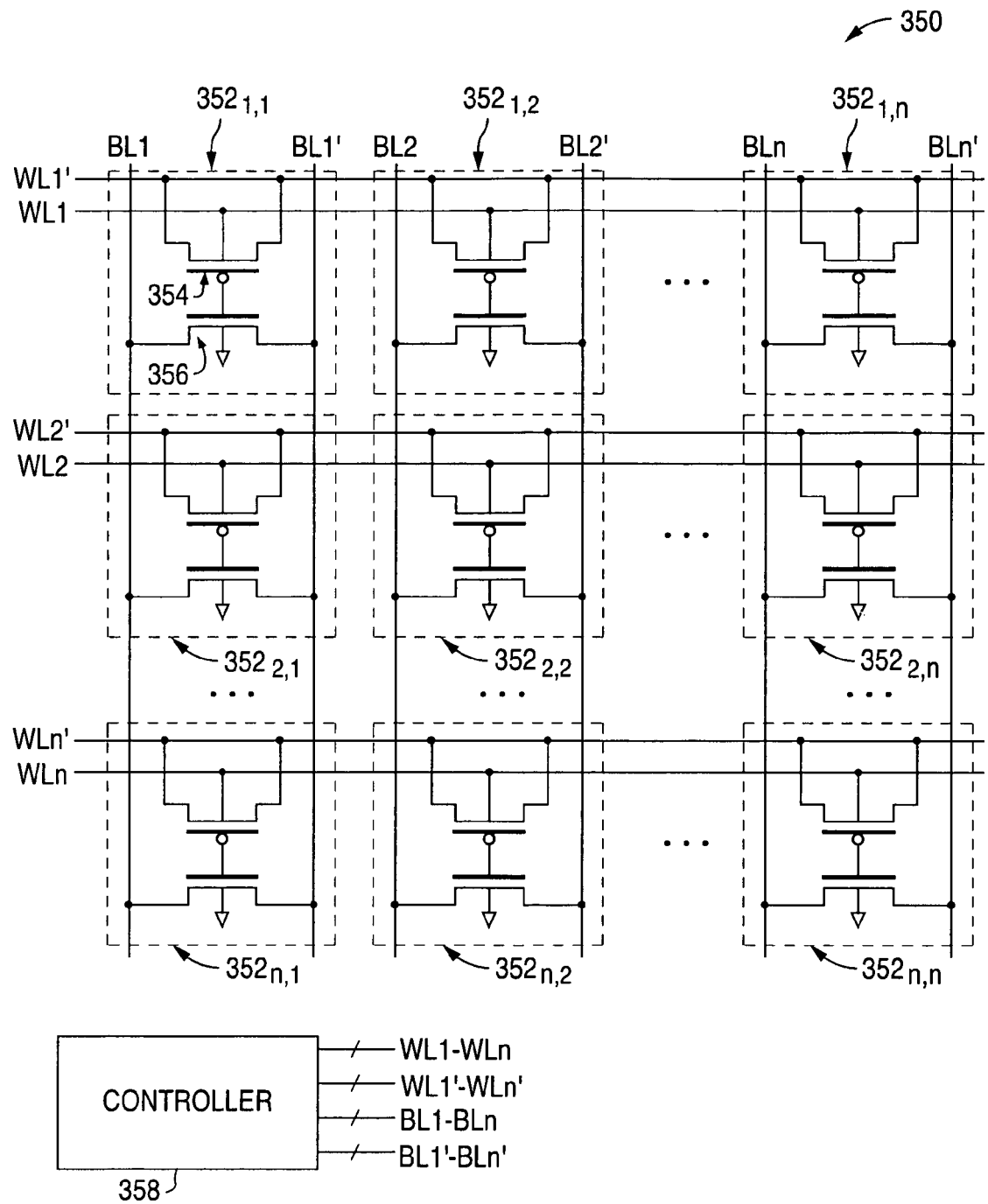

FIGS. 3A and 3B illustrate example non-volatile memory cell arrays according to this disclosure. The embodiments of the memory cell arrays shown in FIGS. 3A and 3B are for illustration only. Other embodiments of the memory cell arrays could be used without departing from the scope of this disclosure.

As shown in FIG. 3A, a memory cell array 300 is formed from various memory cells $302_{1,1}$-$302_{1,n}$, $302_{2,1}$-$302_{2,n}$, ... $302_{n,1}$-$302_{n,n}$. At least some of the memory cells may be the same as or similar to the memory cell 100 shown in FIG. 1A. For example, each memory cell could include a PMOS transistor 304 acting as a program transistor and an NMOS transistor 306 acting as an erase capacitor. Each memory cell is coupled to one write line (WL1, ..., WLn) and to two bit lines (BL1-BL1', ..., BLn-BLn'). Each transistor 304 has its source, body, and drain coupled to one of the write lines. Each transistor 306 has its source coupled to one of the bit lines, its drain coupled to another of the bit lines, and its body coupled to ground. The transistors 304-306 have their gates coupled together to form a floating gate.

In this arrangement, a memory cell in the array 300 can be erased, programmed, or read by applying a suitable voltage to its write line and/or a suitable voltage(s) to its bit lines. Examples of the signals that can be applied to the various write and bit lines of a selected memory cell during operation of the memory cell array 300 are shown in Table 1.

TABLE 1

|  | WL | BL | BL' |
|---|---|---|---|
| Program | $V_{WL}$ | $V_{Prog}$ | $V_{Prog}$ |
| Erase | $V_E$ | 0 V | 0 V |
| Program inhibition | $V_{WL}$ 0 V | 0 V $V_{Prog}$ | 0 V $V_{Prog}$ |
| Read | $V_{Read}$ | 1 V | 0 V |

Here, $V_{WL}$ may equal or approximately equal −5V, $V_{Prog}$ may equal or approximately equal 5V, $V_E$ may equal or approximately equal −12V, and $V_{Read}$ may equal or approximately equal 1V. The unselected lines may be biased at or near 0V. These values may vary depending on the implementation of the memory cells in the array 300. Also, the "program inhibition" values can be used to inhibit the accidental programming of the memory cells in the array 300 (without triggering a read or other operation).

The memory array 300 also includes or is coupled to a controller 306. The controller 306 represents any suitable structure for controlling the operation of the memory cells in the array 300. In this example, the controller 306 is coupled to the write lines and bit lines of the array 300 and provides suitable control signals to the lines. This enables the controller 306 to control the erasure, programming, and reading of the memory cells in the array 300.

As shown in FIG. 3B, a memory cell array 350 is formed from various memory cells $352_{1,1}$-$352_{1,n}$, $352_{2,1}$-$352_{2,n}$, ... $352_{n,1}$-$352_{n,n}$. At least some of the memory cells may be the same as or similar to the memory cell 150 shown in FIG. 1B. For example, each memory cell could include a PMOS transistor 354 acting as a program transistor and an NMOS transistor 356 acting as an erase capacitor. Each memory cell is coupled to two write lines (WL1-WL1', ..., WLn-WLn') and to two bit lines (BL1-BL1', ..., BLn-BLn'). Each transistor 354 has its body coupled to one of the write lines and its source and drain coupled to another of the write lines. Each transistor 356 has its source coupled to one of the bit lines, its drain coupled to another of the bit lines, and its body coupled to ground. The transistors 354-356 have their gates coupled together to form a floating gate.

In this arrangement, a memory cell in the array 350 can be erased, programmed, or read by applying a suitable voltage(s) to its write lines and/or a suitable voltage(s) to its bit lines. Examples of the various signals that can be applied to the various write and bit lines of a selected memory cell during operation of the memory cell array 350 are shown in Table 2.

TABLE 2

|  | WL | WL' | BL | BL' |
|---|---|---|---|---|
| Program | $V_{WL}$ | $V_{WL}'$ | 0 V | 0 V |
| Erase | $V_E$ | $V_E$ | $V_{Erase}$ | $V_{Erase}$ |
| Erase | $V_E$ | $V_E$ | 0 V | 0 V |
| inhibition | 0 V | 0 V | $V_{Erase}$ | $V_{Erase}$ |
| Read | $V_{Read}$ | $V_{Read}$ | 1 V | 0 V |

Here, $V_{WL}$ may equal or approximately equal −1V, $V_{WL}'$ may equal or approximately equal −5V, $V_E$ may equal or approximately equal −5V, $V_{Erase}$ may equal or approximately equal +5V, and $V_{Read}$ may equal or approximately equal 1V. The unselected lines may be biased at or near 0V. Also, the "erase inhibition" values can be used to inhibit the accidental erasure of the memory cells in the array 350.

The memory array 350 also includes or is coupled to a controller 358. The controller 358 represents any suitable structure for controlling the operation of the memory cells in the array 300.

As described above, the memory cells in the arrays 300 and 350 are programmed by generating hot electrons at the source and the drain of the program transistors in the memory cells. The memory cells in the array 300 are erased using Fowler-Nordheim tunneling, while the memory cells in the array 350 are erased using hot hole injection.

Although FIGS. 3A and 3B illustrate examples of non-volatile memory cell arrays, various changes may be made to FIGS. 3A and 3B. For example, each memory cell array could have any suitable number of memory cells in any suitable arrangement. As a particular example, while shown as an n×n array, each memory cell array could have any other equal or non-equal dimensions.

Figure 4A:
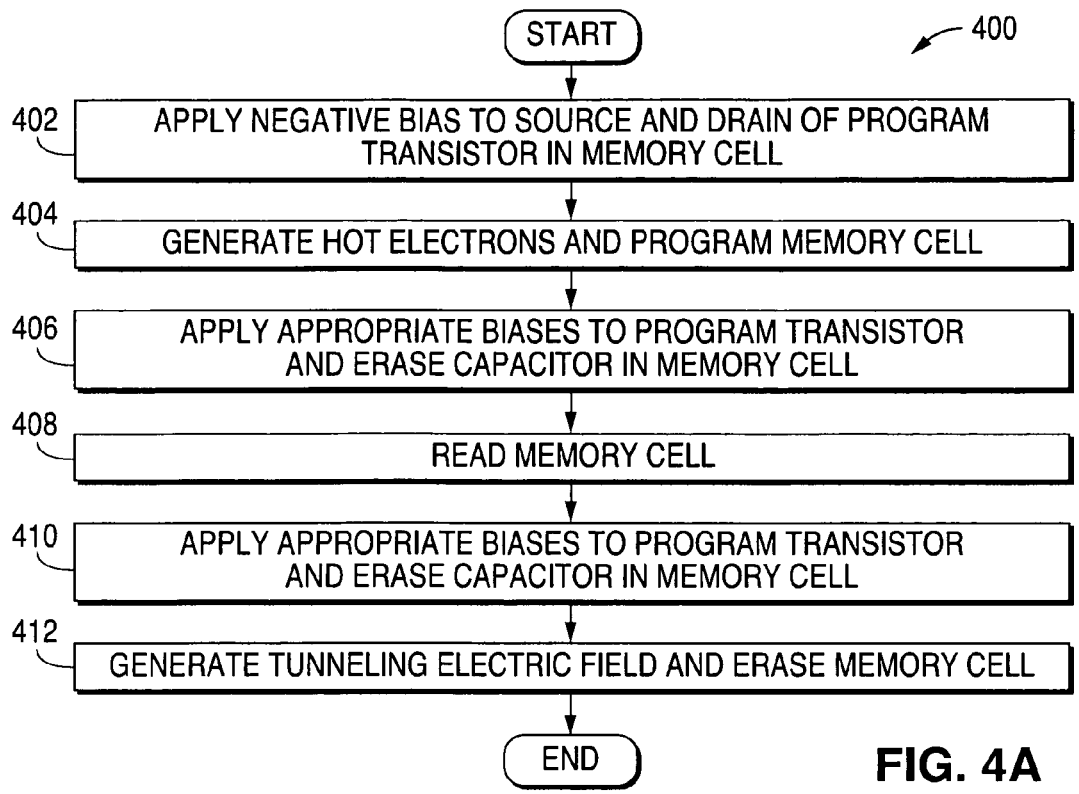
FIGS. 4A and 4B illustrate example methods for programming, reading, and erasing a non-volatile memory cell according to this disclosure.
Figure 4B:
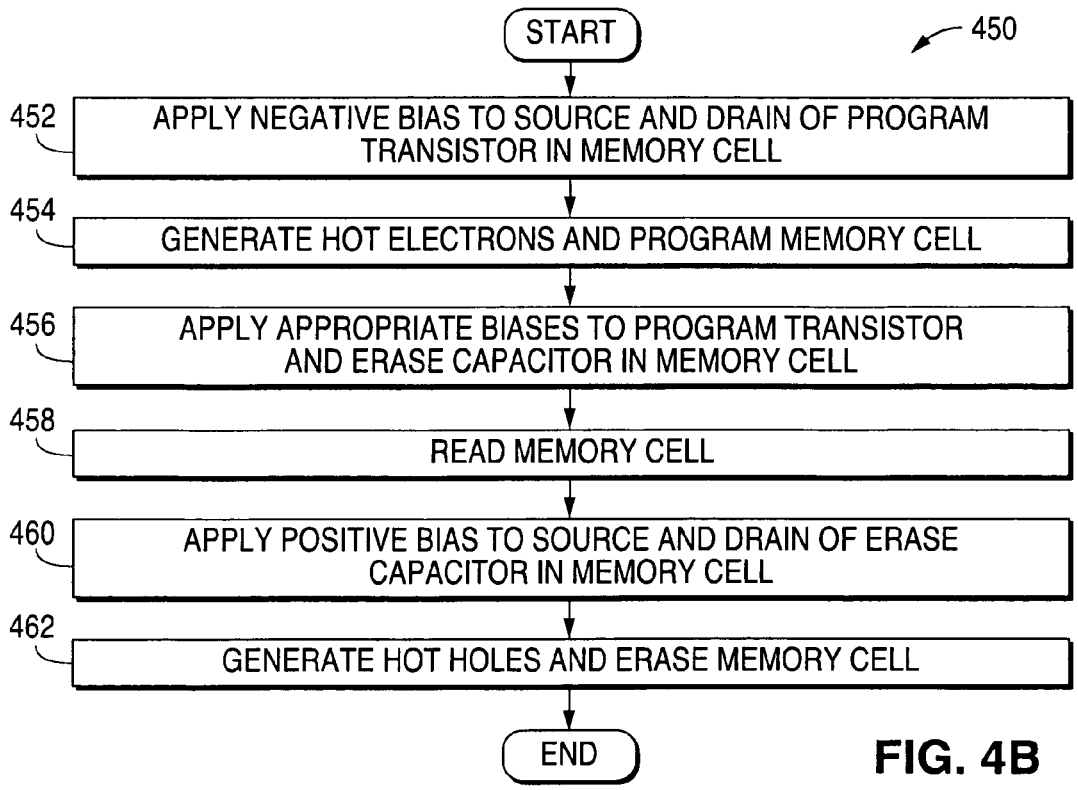

FIGS. 4A and 4B illustrate example methods for programming, reading, and erasing a non-volatile memory cell according to this disclosure. The embodiments of the methods shown in FIGS. 4A and 4B are for illustration only. Other embodiments of the methods could be used without departing from the scope of this disclosure.

In FIG. 4A, a method 400 is illustrated that uses hot electron injection for programming a memory cell 100 and Fowler-Nordheim tunneling for erasing the memory cell 100. To program the memory cell, a negative bias is applied to the source and the drain of a program transistor in the memory cell at step 402. This could include, for example, applying the "program" voltages shown in Table 1 above to the bit lines 108-110 and write line 112 of the memory cell 100. As a particular example, this could include applying a negative voltage (such as −5V) on the write line 112 coupled to the PMOS transistor 102 in the memory cell 100. Hot electrons are generated by the program transistor and used to program the memory cell at step 404. This could include, for example, generating hot electrons at both the source and the drain of the PMOS transistor 102 in the memory cell 100, and at least some of the hot electrons are injected onto the floating gate 106 of the memory cell 100.

To read the memory cell, appropriate biases are applied to the program transistor and an erase capacitor in the memory cell at step 406. This could include, for example, applying the "read" voltages shown in Table 1 above to the bit lines 108-110 and write line 112 of the memory cell 100. This allows the memory cell to be read at step 408. This could include, for example, determining whether the current from the memory cell 100 represents a higher level of current or a lower level of current. The different current levels may correspond to different memory states of the memory cell 100. As a particular example, a higher current level could correspond to a memory cell 100 that has been programmed to a "1" state, and a lower current level could correspond to a memory cell 100 that has been not programmed or that has been erased and is therefore in the "0" state (or vice versa).

To erase the memory cell using Fowler-Nordheim tunneling, appropriate biases are applied to the program transistor and the erase capacitor in the memory cell at step 410. This could include, for example, applying the "erase" voltages shown in Table 1 above to the bit lines 108-110 and write line 112 of the memory cell 100. This leads to the creation of a tunneling electric field and erasure of the memory cell at step 412. This could include, for example, forming a tunneling electric field through the gate oxide 226b of the memory cell 100, allowing electrons to leave the floating gate 106 via the erase capacitor (transistor 104) in the memory cell 100.

In FIG. 4B, a method 450 is illustrated that uses hot electron injection for programming a memory cell 150 and hot hole injection for erasing the memory cell 150. To program the memory cell, a negative bias is applied to the source and the drain of a program transistor in the memory cell at step 452, and hot electrons are generated and used to program the memory cell at step 454. To read the memory cell, appropriate biases are applied to the program transistor and an erase capacitor in the memory cell at step 456, and the memory cell is read at step 458. These steps 452-458 may be the same as or similar to the corresponding steps 402-408 in FIG. 4A (except steps 452-458 involve the memory cell 150 of FIG. 1B and the voltages shown in Table 2).

To erase the memory cell using hot hole injection, a positive bias is applied to the source and the drain of the erase capacitor in the memory cell at step 460. This could include, for example, applying the "erase" voltages shown in Table 2 above to the bit lines 158-160 and write lines 162-164 of the memory cell 150. As a particular example, this could include applying a positive voltage (such as 5V) on the bit lines 162-164 coupled to the NMOS transistor 154 in the memory cell 150. Hot holes are generated by the erase capacitor and used to erase the memory cell at step 462. This could include, for example, generating hot holes at both the source and the drain of the NMOS transistor 154 in the memory cell 150, and at least some of the hot holes are injected onto the floating gate 156 of the memory cell 150. This allows electrons on the floating gate 156 to recombine with the hot holes in the memory cell 150.

Although FIGS. 4A and 4B illustrate two examples of methods for programming, reading, and erasing a non-volatile memory cell, various changes may be made to FIGS. 4A and 4B. For example, any other suitable voltages could be used to program, read, and erase the memory cell. Also, while shown as a series of steps, various steps in FIGS. 4A and 4B could overlap, occur in parallel, or occur multiple times. As a particular example, the memory cell 100 or 150 could be programmed, read, and erased multiple times and in any suitable order of operations.

It may be advantageous to set forth definitions of certain words and phrases that have been used within this patent document. The terms "high" and "low," and their derivatives, refer to relative values and are not meant to denote a specific value or range of values. The term "couple" and its derivatives refer to any direct or indirect communication between two or more components, whether or not those components are in physical contact with one another. The term "program" and its derivatives refer to any operation to store data, whether that operation is referred to as a write operation, a program operation, or other type of operation. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. The term "controller" means any device, system, or part thereof that controls at least one operation. A controller may be implemented in hardware, firmware, software, or some combination of at least two of the same. The functionality associated with any particular controller may be centralized or distributed, whether locally or remotely.

While this disclosure has described certain embodiments and generally associated methods, alterations and permutations of these embodiments and methods will be apparent to those skilled in the art. Accordingly, the above description of example embodiments does not define or constrain this invention. Other changes, substitutions, and alterations are also possible without departing from the spirit and scope of this invention as defined by the following claims.

What is claimed is:

1. A method comprising:
applying a first voltage to a source and a drain of a first transistor in a memory cell;
injecting electrons from the source and the drain of the first transistor onto a floating gate in the memory cell, the floating gate comprising a first gate of the first transistor coupled to a second gate of a second transistor in the memory cell;
applying a second voltage to a source and a drain of the second transistor; and
injecting hot holes from the source and the drain of the second transistor onto the floating gate.

2. The method of claim 1, wherein:
the first transistor comprises a p-channel metal oxide semiconductor (PMOS) transistor; and
applying the first voltage comprises applying a negative voltage to the source and the drain of the PMOS transistor.

3. The method of claim 2, wherein the negative voltage comprises −5V.

4. The method of claim 2, further comprising:
generating, based on the first voltage, a gate injection current of at least 50 $pA/\mu m^2$ using no more than 0.05 $\mu A/um^2$ of reverse junction leakage current in the first transistor.

5. The method of claim 1, wherein the second transistor comprises an n-channel metal oxide semiconductor (NMOS) transistor.

6. The method of claim 5, wherein applying the second voltage comprises applying a positive voltage to the source and the drain of the NMOS transistor.

7. The method of claim 6, wherein the positive voltage comprises +5V.

8. The method of claim 6, further comprising:
generating, based on the second voltage, a gate injection current of at least 1.68 $pA/\mu m^2$ in the second transistor using no more than 0.9 $\mu A/um^2$ of reverse junction leakage current in the second transistor.

9. A method comprising:
applying a first voltage to a source and a drain of a first transistor in a memory cell;
injecting electrons from the source and the drain of the first transistor onto a floating gate in the memory cell, the floating gate comprising a first gate of the first transistor coupled to a second gate of a second transistor in the memory cell; and
generating an electric field across a gate oxide of the second transistor to allow electrons on the floating gate to tunnel through the gate oxide.

10. A memory cell comprising:
a first transistor having a source, a gate, and a drain;
a second transistor having a source, a gate, and a drain, wherein the gate of the first transistor and the gate of the second transistor are coupled to form a floating gate;
at least one first line coupled to the first transistor and configured to deliver a first voltage to the first transistor; and
at least one second line coupled to the second transistor and configured to deliver a second voltage to the second transistor;

wherein the first voltage causes electrons from the source and the drain of the first transistor to be injected onto the floating gate; and wherein the second voltage causes hot holes from the source and the drain of the second transistor to be injected onto the floating gate.

11. The memory cell of claim 10, wherein:

the first transistor comprises a p-channel metal oxide semiconductor (PMOS) transistor; and the at least one first line is configured to deliver a negative voltage to the source and the drain of the PMOS transistor.

12. The memory cell of claim 10, wherein the second transistor comprises an n-channel metal oxide semiconductor (NMOS) transistor.

13. The memory cell of claim 12, wherein the at least one second line is configured to deliver a positive voltage to the source and the drain of the NMOS transistor.

14. The memory cell of claim 12, wherein:

during programming of the memory cell, a gate injection current of at least 50 pA/$\mu$m$^2$ is generated in the first transistor based on the first voltage and using no more than 0.05 $\mu$A/um$^2$ of reverse junction leakage current in the first transistor; and during erasure of the memory cell, a gate injection current of at least 1.68 pA/$\mu$m$^2$ is generated in the second transistor based on the second voltage and using no more than 0.9 $\mu$A/um$^2$ of reverse junction leakage current in the second transistor.

15. A memory cell comprising:

a first transistor having a source, a gate, and a drain;

a second transistor having a source, a gate, and a drain, wherein the gate of the first transistor and the gate of the second transistor are coupled to form a floating gate;

at least one first line coupled to the first transistor and configured to deliver a first voltage to the first transistor; and at least one second line coupled to the second transistor and configured to deliver a second voltage to the second transistor;

wherein the first voltage causes electrons from the source and the drain of the first transistor to be injected onto the floating gate; and wherein the second voltage causes an electric field to be generated across a gate oxide of the second transistor to allow electrons on the floating gate to tunnel through the gate oxide.

16. A memory array comprising a plurality of memory cells, at least one of the memory cells comprising:

a first transistor having a source, a gate, and a drain;

a second transistor having a source, a gate, and a drain, wherein the gate of the first transistor and the gate of the second transistor are coupled to form a floating gate;

at least one first line coupled to the first transistor and configured to deliver a first voltage to the first transistor; and at least one second line coupled to the second transistor and configured to deliver a second voltage to the second transistor;

wherein the first voltage causes electrons from the source and the drain of the first transistor to be injected onto the floating gate; and wherein the second voltage causes hot holes from the source and the drain of the second transistor to be injected onto the floating gate.

17. The memory array of claim 16, wherein:

the first transistor comprises a p-channel metal oxide semiconductor (PMOS) transistor; and the at least one first line is configured to deliver a negative voltage to the source and the drain of the PMOS transistor.

18. The memory array of claim 16, wherein the second transistor comprises an n-channel metal oxide semiconductor (NMOS) transistor.

19. The memory array of claim 18, wherein the at least one second line is configured to deliver a positive voltage to the source and the drain of the NMOS transistor.

20. A memory array comprising a plurality of memory cells, at least one of the memory cells comprising:

a first transistor having a source, a gate, and a drain;

a second transistor having a source, a gate, and a drain, wherein the gate of the first transistor and the gate of the second transistor are coupled to form a floating gate;

at least one first line coupled to the first transistor and configured to deliver a first voltage to the first transistor; and at least one second line coupled to the second transistor and configured to deliver a second voltage to the second transistor;

wherein the first voltage causes electrons from the source and the drain of the first transistor to be injected onto the floating gate; and wherein the second voltage causes an electric field to be generated across a gate oxide of the second transistor to allow electrons on the floating gate to tunnel through the gate oxide.

* * * * *